US012776035B2

(12) United States Patent
Allen et al.

(10) Patent No.: US 12,776,035 B2
(45) Date of Patent: Oct. 27, 2026

(54) MULTIPLE ORTHOGONAL SLICE PROCESSING AND SEPARATION TO OBTAIN TEMPERATURE INFORMATION FOR MRI THERMOMETRY

(71) Applicant: Brigham Young University (BYU), Provo, UT (US)

(72) Inventors: Steven Paul Allen, Springville, UT (US); Matthew David Osburn, Mapleton, UT (US)

(73) Assignee: Brigham Young University (BYU), Provo, UT (US)

(*) Notice: Subject to any disclaimer, the term of this patent is extended or adjusted under 35 U.S.C. 154(b) by 249 days.

(21) Appl. No.: 18/486,769

(22) Filed: Oct. 13, 2023

(65) Prior Publication Data

US 2024/0135538 A1 Apr. 25, 2024

Related U.S. Application Data

(60) Provisional application No. 63/379,413, filed on Oct. 13, 2022.

(51) Int. Cl.
*G06T 7/00* (2017.01)
*G01R 33/48* (2006.01)
(Continued)

(52) U.S. Cl.
CPC ........ *G06T 7/0012* (2013.01); *G01R 33/4804* (2013.01); *G06T 5/10* (2013.01);
(Continued)

(58) Field of Classification Search
CPC ........... G06T 7/0012; G06T 5/10; G06T 5/50; G06T 5/70; G06T 2207/10088;
(Continued)

(56) References Cited

U.S. PATENT DOCUMENTS 10,921,407 B2 2/2021 Paulson et al.
11,493,583 B1 * 11/2022 Majeed ............ G01R 33/56509
(Continued)

FOREIGN PATENT DOCUMENTS

EP 2526438 B1 6/2016
WO 2021030466 A1 2/2021

OTHER PUBLICATIONS

K. Quah et al.: "Simultaneous multislice MRI thermometry with a single coil using incoherent blipped-controlled aliasing," Magnetic Resonance in Medicine, vol. 83, Issue 2, Feb. 2020, pp. 479-491.

*Primary Examiner* — Amandeep Saini
*Assistant Examiner* — Andrew S Budisalich
(74) *Attorney, Agent, or Firm* — Brake Hughes Bellermann LLP

(57) ABSTRACT

A method includes decomposing, for each of a plurality of orthogonal slices, a set of PRF baseline images for the orthogonal slice into a set of baseline image features for the orthogonal slice; acquiring, using a magnetic imaging resonance (MRI) scanner of a MRI system based on a RF excitation pulse sequence for each of the plurality of orthogonal slices, a combined multi-encoded PRF treatment image; subtracting a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features; and processing the combined treatment-specific temperature information to obtain slice-specific treatment-specific temperature information for each of the plurality of orthogonal slices.

20 Claims, 5 Drawing Sheets

(51) Int. Cl.

| | |
|---|---|
| ***G01R 33/483*** | (2006.01) |
| ***G06T 5/10*** | (2006.01) |
| ***G06T 5/50*** | (2006.01) |
| ***G06T 5/70*** | (2024.01) |

(52) U.S. Cl.
CPC .................. *G06T 5/50* (2013.01); *G06T 5/70* (2024.01); *G06T 2207/10088* (2013.01); *G06T 2207/20056* (2013.01); *G06T 2207/20064* (2013.01); *G06T 2207/20224* (2013.01)

(58) Field of Classification Search
CPC . G06T 2207/20056; G06T 2207/20064; G06T 2207/20224; G01R 33/4804; G01R 33/4833; G01R 33/4814
See application file for complete search history.

(56) References Cited

U.S. PATENT DOCUMENTS

| | | | | |
|---|---|---|---|---|
| 2011/0178386 | A1* | 7/2011 | Grissom ............ | G01R 33/4804 600/410 |
| 2019/0113587 | A1* | 4/2019 | Paulson ............. | G01R 33/4808 |
| 2021/0035325 | A1* | 2/2021 | Yang .......................... | G06T 7/73 |
| 2022/0179023 | A1* | 6/2022 | Wu .................... | G01R 33/4826 |

* cited by examiner

MULTIPLE ORTHOGONAL SLICE PROCESSING AND SEPARATION TO OBTAIN TEMPERATURE INFORMATION FOR MRI THERMOMETRY

CROSS-REFERENCE TO RELATED APPLICATIONS

This application claims priority to U.S. Provisional Application No. 63/379,413, filed on Oct. 13, 2022, entitled, "ORTHOGONAL PLANE MAGNETIC RESONANCE IMAGING THERMOMETRY FOR FOCUSED ULTRASOUND THERMAL ABLATION SURGERIES", the entirety of which is hereby incorporated by reference.

TECHNICAL FIELD

This description relates to magnetic resonance imaging (MRI) thermometry.

BACKGROUND

Heat-based tumor ablation techniques using thermal energy sources, such as radiofrequency, laser, ultrasound, microwave, etc., have been used as minimally invasive strategies for a variety of medical treatments, including the treatment of tumors in various organs. Challenges exist in obtaining accurate temperature information of an imaging region of a patient during a thermal ablation or other medical treatment.

SUMMARY

According to an example embodiment, a method may include decomposing, for each of a plurality of orthogonal slices, a set of proton resonance frequency (PRF) baseline images for the orthogonal slice into a set of baseline image features for the orthogonal slice, wherein each of the sets of baseline image features includes amplitude and phase information; acquiring, using a magnetic imaging resonance (MRI) scanner of a MRI system based on a radio frequency (RF) excitation pulse sequence for each of the plurality of orthogonal slices, a combined multi-encoded PRF treatment image of the imaging region that includes amplitude and phase information; subtracting a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features; and processing the combined treatment-specific temperature information of the imaging region to obtain slice-specific treatment-specific temperature information for each of the plurality of orthogonal slices.

According to an example embodiment, an apparatus may include at least one processor, and at least one memory including computer program code, the at least one memory and the computer program code configured to, with the at least one processor, cause the apparatus at least to decompose, for each of a plurality of orthogonal slices, a set of proton resonance frequency (PRF) baseline images for the orthogonal slice into a set of baseline image features for the orthogonal slice, wherein each of the sets of baseline image features includes amplitude and phase information; acquire, using a magnetic imaging resonance (MRI) scanner of a MRI system based on a radio frequency (RF) excitation pulse sequence for each of the plurality of orthogonal slices, a combined multi-encoded PRF treatment image of the imaging region that includes amplitude and phase information; subtract a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features; and process the combined treatment-specific temperature information of the imaging region to obtain slice-specific treatment-specific temperature information for each of the plurality of orthogonal slices.

According to an example embodiment, an apparatus may include a non-transitory computer-readable storage medium comprising instructions stored thereon that, when executed by at least one processor, are configured to cause a computing system to decompose, for each of a plurality of orthogonal slices, a set of proton resonance frequency (PRF) baseline images for the orthogonal slice into a set of baseline image features for the orthogonal slice, wherein each of the sets of baseline image features includes amplitude and phase information; acquire, using a magnetic imaging resonance (MRI) scanner of a MRI system based on a radio frequency (RF) excitation pulse sequence for each of the plurality of orthogonal slices, a combined multi-encoded PRF treatment image of the imaging region that includes amplitude and phase information; subtract a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features; and process the combined treatment-specific temperature information of the imaging region to obtain slice-specific treatment-specific temperature information for each of the plurality of orthogonal slices.

Other example embodiments are provided or described for each of the example methods, including: means for performing any of the example methods; a non-transitory computer-readable storage medium comprising instructions stored thereon that, when executed by at least one processor, are configured to cause a computing system to perform any of the example methods; and an apparatus including at least one processor, and at least one memory including computer program code, the at least one memory and the computer program code configured to, with the at least one processor, cause the apparatus at least to perform any of the example methods.

The details of one or more examples of embodiments are set forth in the accompanying drawings and the description below. Other features will be apparent from the description and drawings, and from the claims.

DETAILED DESCRIPTION

Potential benefits of thermal ablation may include the ability to non-surgically apply treatments to an area or organ of a patient, potentially on an out-patient basis. In some cases, thermal ablation techniques were applied with limited knowledge of thermal distribution at the target area or organ. However, more recently, non-invasive temperature monitoring has been used with magnetic resonance imaging (MRI) of the treatment area based on temperature sensitive MR parameters such as the proton resonance frequency (PRF).

For example, focused ultrasound surgery (FUS) is a knifeless procedure that may be used for drug-resistant essential tremor (ET) patients. FUS transmits ultrasound through the intact scalp and into the brain. The ultrasound relieves symptoms by thermally ablating neurons associated with uncontrolled limb shaking. For safety, simultaneous magnetic resonance imaging (MRI) may be used to measure the temperature of a 2D (two-dimensional) "slice" that transects the surgical target. However, even with MRI guidance, FUS procedures can still harm a patient's gait and sensory perception by accidentally ablating additional neurons. This is because natural variations in patient anatomy may push the locus of heating outside the captured 2D temperature slice. In some cases, ablations outside of this slice cannot be observed or prevented by the surgeon.

Figure 1:
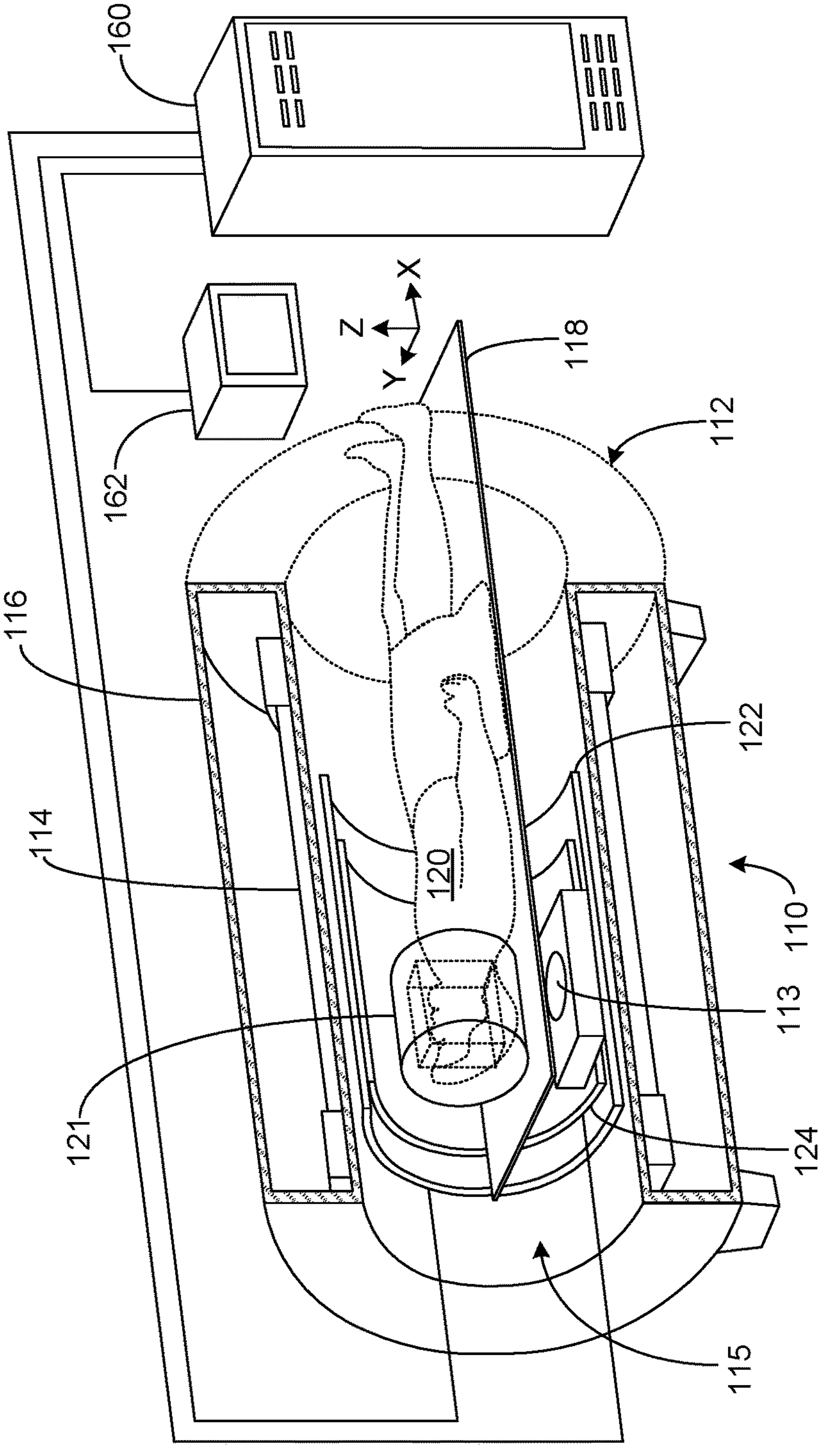
FIG. 1 is a block diagram of a magnetic imaging (MRI) system in which proton resonance frequency (PRF) MRI thermometry may be performed during a thermal ablation or other medical treatment of an imaging region of a patient according to an example embodiment.

FIG. 1 is a block diagram of a magnetic resonance imaging (MRI) system in which proton resonance frequency (PRF) MRI thermometry may be performed during a thermal ablation or other medical treatment of an imaging region of a patient according to an example embodiment. System 110 is shown, and may include an MRI system 112. During treatment or thermal ablation, a thermal therapy device 113 that may be disposed within the bore of the MRI system 112. The thermal therapy device 113 may be, e.g., an ultrasound transducer for producing ultrasound waves, a RF (radio frequency) or microwave ablation device, a laser, or other energy producing device that may produce energy and thereby heat a tissue region or imaging region of a patient 120, and may be provided outside the patient or for insertion into the patient's body. The MRI system 112 may include a cylindrical electromagnet 114, which may generate a (e.g., static) magnetic field within a bore 115 of the electromagnet 114. The electromagnet 114 may be enclosed in a magnet housing 116. A support table 118, upon which patient 120 lies during treatment, may be located within the magnet bore 105. Patient 120 is positioned such that an imaging region 121 (e.g., the patient's brain, internal organ, or other tissue to receive thermal ablation or other treatment) may receive both energy, such as, ultrasound waves from thermal therapy device 103 (e.g., from an ultrasound transducer) and receive the magnetic field.

The MRI system 112 may include a set of cylindrical magnetic field gradient coils 112, which may be located within the magnet bore 115, surrounding the patient 120. The gradient coils 122 can generate magnetic field gradients. One or more gradient coils 122 may be provided, wherein each gradient coil may generate magnetic field gradients in mutually orthogonal directions. Using the field gradients, different spatial locations can be associated with different precession frequencies, thereby giving an MR image its spatial resolution. Further, an RF transmitter coil 124 surrounds the imaging region 121. The RF transmitter coil 124 emits an RF excitation pulse (or multiple RF excitation pulses) into the imaging region 116, thereby changing the net magnetization of the imaged tissue. The RF transmitter coil 124 (which may include one or more coils) may also be used to receive MR response signals emitted from the imaging region 121. The MR response signals are amplified, conditioned, digitized into raw data, and converted into arrays of image data using an image-processing system 160. The image data may then be displayed on a monitor 162, which may be any display.

In some example MR imaging procedures, the emission of the RF excitation pulse(s), the application of the field gradients in one or more directions, and the acquisition of the RF response signal may be performed in a predetermined sequence. For example, in some imaging sequences, a linear field gradient parallel to the static magnetic field is applied simultaneously with the RF excitation pulse to select a slice within the three-dimensional tissue for imaging. Subsequently, time-dependent gradients parallel to the imaging plane may be used to impart a position-dependent phase and frequency on the magnetization vector. Alternatively, an imaging sequence may be designed for a three-dimensional imaging region. Time sequences suitable for PRF thermometry include, for example, gradient-recalled echo (GRE) and spin echo sequences.

The time-varying RF response signal, which may be integrated over the entire (two- or three-dimensional) imaging region, may be sampled to produce a time series of response signals that constitute the raw image data, e.g., a treatment image of the imaging region. Each data point in this time series can be interpreted as the value of the Fourier transform of the position-dependent local magnetization at a particular point in k space, where k is a function of the time development of the gradient fields. Thus, by acquiring a time series of the response signal and Fourier-transforming it, a real-space image of the tissue (e.g., an image showing the measured magnetization-affecting tissue properties as a function of spatial coordinates) can be reconstructed from the raw data. Computational methods for constructing real-space image data from the raw data (including, e.g., Fast Fourier Transform) may be performed by image-processing system 160 in hardware, software, or a combination of both.

In the presence of therapy-induced temperature changes, a hot spot may appear in the phase of the image data because the resonance frequency of water protons decreases with increasing temperature. Accordingly, for the purpose of PRF thermometry, the image-processing system 160 may include functionality for extracting phase information from the real-space image data, and computing a real-space map of the temperature-induced phase shift based on images acquired before (e.g., baseline images) as well as after (or during) heating of the target tissue (treatment images). From the phase shift map, a map of temperature changes (e.g., which may be provided in units of change in ° C.) may be computed based on a mathematical relationship between image phase and temperature or change in temperature. An image phase may be determined or calculated for each pixel of the image.

Figure 2:
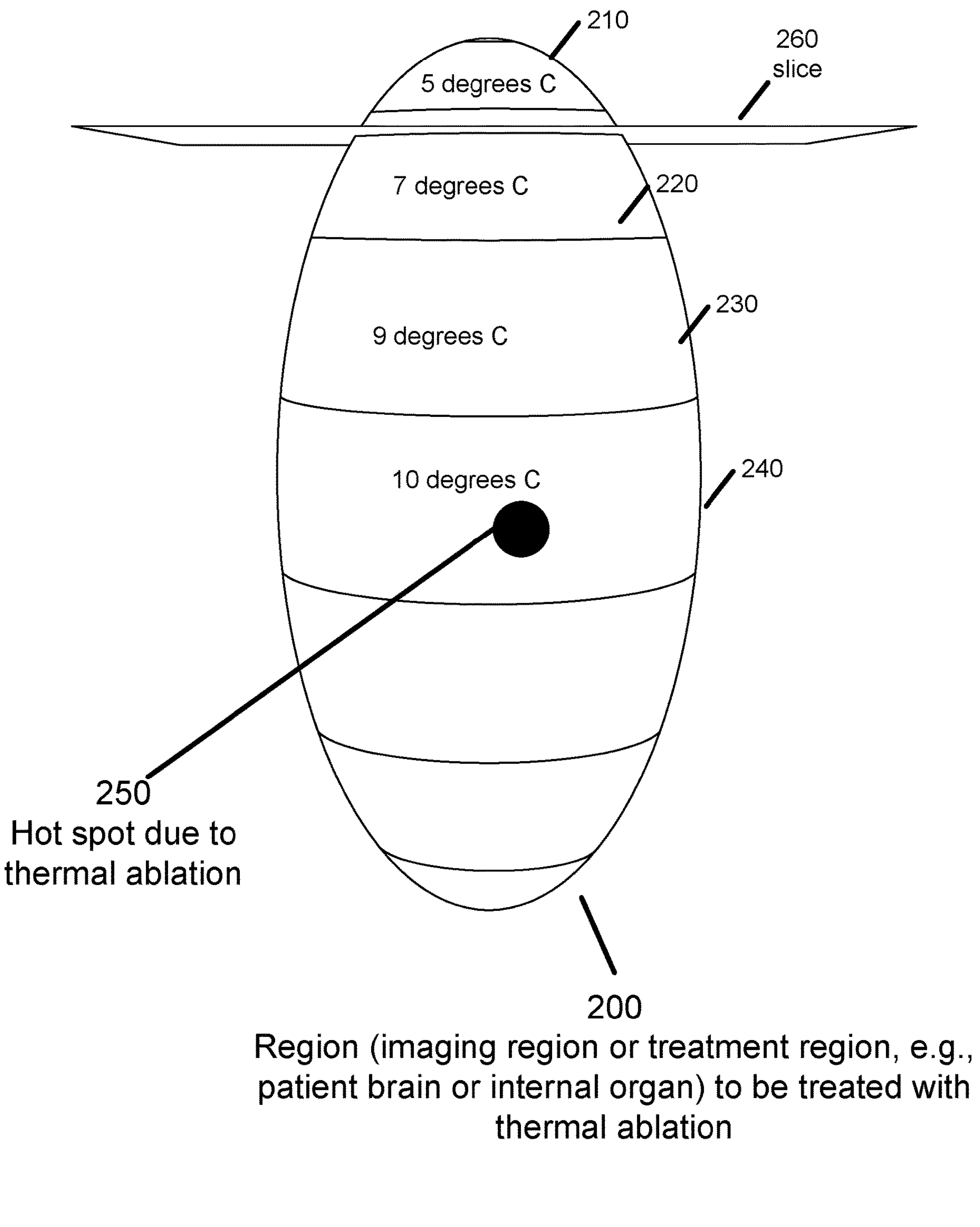
FIG. 2 is a diagram illustrating a slice of a region that may be treated with thermal ablation.

FIG. 2 is a diagram illustrating a slice of a region that may be treated with thermal ablation. Region 200 may be a treatment region that may undergo thermal ablation or other treatment. Region 200 may also be imaged using MRI thermometry to allow monitoring the temperature within the region 200. Region 200 may be considered (or may be referred to as) a treatment region or an imaging region. However, during thermal ablation, ultrasound waves or other energy may be applied to region 200, which may result in a hot spot 250. As a result of this thermal ablation of region 200, there may be a temperature distribution or range within region 200. Sub-region 240 (closest to where the hot spot 250 is located) may be 10 degrees Celsius, for example. Sub-regions 210, 220 and 230 may have temperatures of about 5, 7 and 9 degrees Celsius, respectively. However, if this region is imaged directly in the center, the surgeons may obtain an accurate indication of the temperature that results from the ablation (e.g., the maximum temperature). However, if the region 200 is imaged at a slice 260 that is offset, or the slice is not in the center of region 200, this may provide inaccurate temperature (or inaccurate maximum temperature) information of the region 200. This can cause serious risk to patients and cause damage or side effects to the patient.

Figure 3:
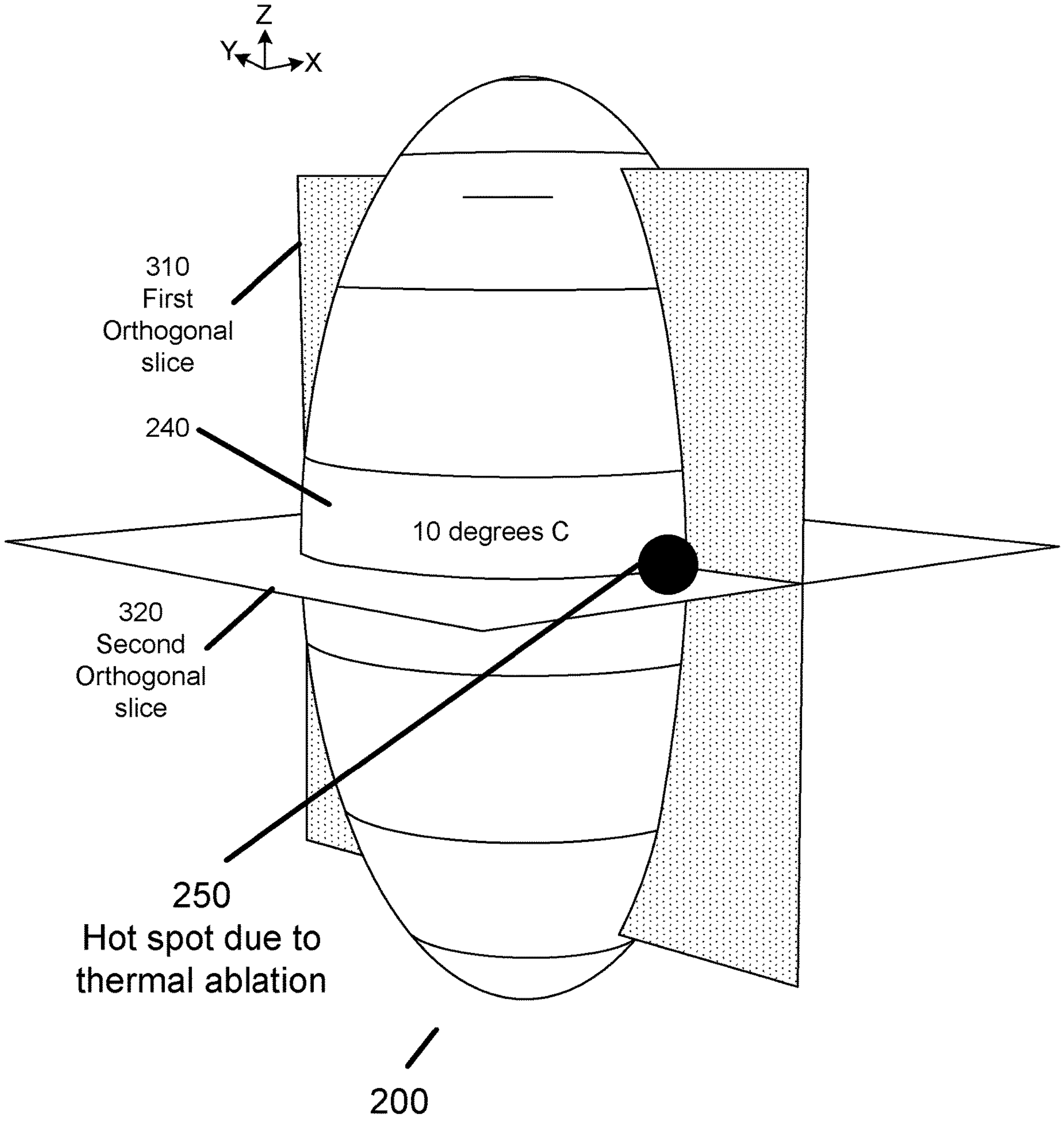
FIG. 3 is a diagram illustrating multiple orthogonal slices of a region that may be treated with thermal ablation.

FIG. 3 is a diagram illustrating multiple orthogonal slices of a region that may be treated with thermal ablation. In FIG. 3, multiple orthogonal slices are imaged using MRI thermometry to obtain more accurate temperature information during thermal ablation or other treatment of region 200. A first orthogonal slice 310 of region 200 is performed or provided along a first axis, and a second orthogonal slice 320 of region is provided along a second axis that may be orthogonal to the first axis. By taking multiple orthogonal slices during treatment of the region 200 (which may be considered as a treatment region or imaging region), more accurate temperature information may be obtained.

Figure 4:
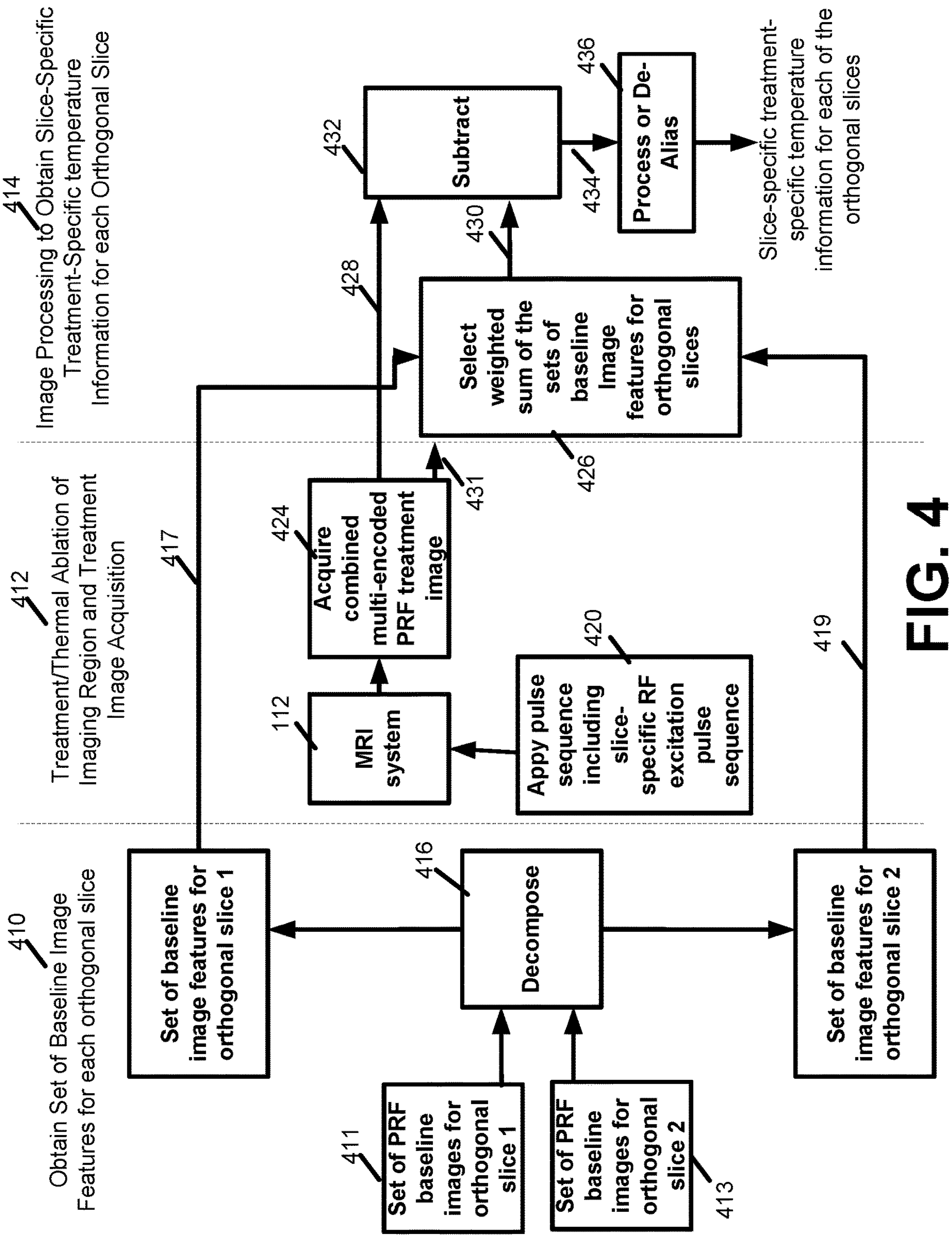
FIG. 4 is a diagram illustrating operation of a system according to an example embodiment.

FIG. 4 is a diagram illustrating operation of a system according to an example embodiment. FIG. 4, for example, may describe one or more techniques that may be used for obtaining temperature information of an imaging region of a patient for magnetic resonance imaging (MRI) thermometry during treatment or thermal ablation of the imaging region of the patient according to an example embodiment. The process illustrated in FIG. 4 may include three general phases, including: 1) at phase 410, before treatment or thermal ablation is performed on a patient, a set of baseline image features is obtained for each of a plurality of orthogonal slices; 2) at phase 412, treatment or thermal ablation of a region is performed, and a treatment image is acquired using MRI thermometry; and, 3) at phase 414, image-processing is performed to obtain slice-specific treatment-specific temperature information for each of the orthogonal slices.

As shown in FIG. 4, within phase 410, at 411, a set of PRF baseline images of the region to be imaged or treated (e.g., of region 200, FIG. 2) are obtained for orthogonal slice 1, e.g., with a MRI scanner of MRI system 112 (FIG. 1). Similarly, at 413, a set of PRF baseline images of the region to be imaged or treated are obtained using MRI system 112 for orthogonal slice 2. PRF baseline images are images acquired, e.g., of the region of the patient using MRI thermometry, but before thermal ablation is performed. In other words, PRF baseline images are obtained before thermal ablation (without thermal energy applied to the region), e.g., without ultrasound waves applied to the region of the patient. Generally, the static magnetic field causes hydrogen nuclei spins (in tissue or water) to align with the magnetic field. RF magnetic pulse fields may be applied to flip some of the aligned spins, which causes an RF response signal (MR response signal or MR echo), which may be detected or measured. The monitoring of temperature with MR imaging is referred to as MR thermometry or MR thermal imaging, e.g., in which proton resonance frequency (PRF) shift method is often used due to its linearity with respect to temperature change. The PRF shift method is based on the MR resonance frequency, wherein a per-pixel temperature within the region is indicated by phase information for that pixel. Thus, each of the PRF baseline images may each indicate phase information per-pixel within the region that indicates or represents temperature at each pixel within the region before treatment or thermal ablation is performed. A library or set of PRF baseline images may be obtained or acquired for each orthogonal image, e.g., at different times, such as at different points when the patient breathes, moves, etc. Because the set of PRF baseline images for each slice are acquired before treatment or thermal ablation is performed, the per-pixel phase information of the set of PRF baseline images indicates or represents temperature or other information (of tissues within the region) that are not associated with or caused by thermal ablation.

Within phase 410, at 416, image-processing system 160 may decompose, for each of a plurality of orthogonal slices (for slices 1 and 2), a set of proton resonance frequency (PRF) baseline images for the orthogonal slice into a set of baseline image features for the orthogonal slice, wherein each of the sets of baseline image features includes amplitude and phase information. Decompose may mean or may include finding within the image or series of images component mathematical functions or representations. The baseline image features, indicated by amplitude and phase information, may indicate or represent one or more features within the region or tissue to be imaged, e.g., including folds or curves of brain tissue (the region to be treated or to be imaged) or baseline temperature at various points or locations (at various pixels of a baseline image) of the region or tissue to be treated. Thus, this operation may obtain a set of baseline image features for orthogonal slice 1, and a set of baseline image features for orthogonal slice 2.

For example, at 416, the decomposing the set of PRF baseline images for the (or for each) slice may include: decomposing, for each of the plurality of orthogonal slices, the set of PRF baseline images for the orthogonal slice into a set of baseline image features for the orthogonal slice, wherein each of the sets of baseline image features includes amplitude and phase information, and (the PRF baseline images or information provided within the PRF baseline images) are not associated with the treatment or thermal ablation of the region 200 (e.g., imaging region or treatment region) of the patient.

In an example embodiment, at 416, the decomposing, for each of the plurality of orthogonal slices, the set of PRF baseline images for the orthogonal slice into a set of baseline image features for the orthogonal slice may be performed based on at least one of the following techniques: a singular value decomposition (SVD) of the set of PRF baseline images for each of the plurality of orthogonal slices; a Fourier Transform (FT) of information of the set of PRF baseline images for each of the plurality of orthogonal slices; or a Wavelet Transform (WT) of information of the set of PRF baseline images for each of the plurality of orthogonal slices. Other techniques may be used as well.

Within phase 412, at 420, during treatment or thermal ablation of at least a portion of the region 200 of the patient, MRI system 112 (FIG. 1) may be used to perform or apply a pulse sequence including a slice-specific RF (radio frequency) excitation pulse sequence for each of the orthogonal slices, wherein each of the slice-specific RF excitation pulse sequences is performed using a different encoding pattern. Thus, for example, a first RF excitation pulse sequence is performed using a first encoding pattern for slice 1, and a second RF excitation pulse sequence is performed using a second encoding pattern for slice 2, wherein the second encoding pattern is different from the first encoding pattern. Performing or applying a different slice-specific RF excitation pulse sequence with a different encoding pattern for each orthogonal slice may allow an easier (or may facilitate) separation or de-aliasing of the different slice-specific images from a combined (multi-slice) treatment image (e.g., performed at 436, FIG. 4, described below).

RF excitation pulses excite a slice of the hydrogen nuclei or spins into the transverse plane, resulting in a RF echo, which can be measured by the MRI. To acquire an image, a series of RF excitation pulses are applied, and a series of RF echoes are recorded. Various encoding patterns may be applied to different slice-specific RF excitation pulses for different orthogonal slices, thereby passing the encoding patterns through to the recorded RF echoes. By applying different encoding patterns to different slice-specific RF excitation pulses, this may modulate or modify the recorded RF echoes from each slice according to the encoding pattern for each slice. One way to accomplish or perform the different encoding patterns is to adjust the RF transmitter phase, which may be an input to MRI system 112, for each slice and each excitation.

Furthermore, at 411 and 412, the same slice-specific RF excitation pulse sequences with different slice-specific encoding patterns applied for each orthogonal slice at 420 during treatment, may also be applied for the different orthogonal slices (slice 1, slice 2) when obtaining the set of PRF baseline images.

Within phase 412, at 424, image-processing system 160 (FIG. 1) may acquire (e.g., from a MRI scanner of MRI system 112), based on the RF excitation pulse sequence for each of the plurality of orthogonal slices, a combined multi-encoded PRF treatment image of the imaging region (e.g., region 200) that includes amplitude and phase information. The combined multi-encoded PRF treatment image is a combination of slice-specific amplitude and phase information (or temperature information) for the plurality of orthogonal slices (e.g., for slice 1 and slice 2) that have been separately encoded using a different encoding pattern for each of the orthogonal slices, and combined into the combined multi-encoded PRF treatment image. The term combined indicates that the combined multi-encoded PRF treatment image is a result of combination of amplitude and/or phase (and/or temperature information) from each of multiple slices. Thus, for example, the combined multi-encoded PRF treatment image may include amplitude and phase information (where the phase information provides temperature information) that indicate per-pixel temperature information associated with both (e.g., which may be a sum of both) the baseline per-pixel temperature information (per-pixel temperature information due to temperature that was present before thermal ablation) and per-pixel temperature information resulting from thermal ablation or treatment, for the multiple slices. Thus, for example, the combined multi-encoded PRF treatment image may include amplitude and phase information for features including both: 1) the set of baseline image features, including amplitude and phase information, for each of the plurality of orthogonal slices and 2) amplitude and phase information for treatment specific features (e.g., amplitude and/or phase information) that resulted from or are associated with treatment or thermal ablation of the imaging region of the patient.

Within phase 414, at 426, image-processing system 160 may receive as inputs: the set of baseline image features for orthogonal slice 1 via line 417, and the set of baseline image features for orthogonal slice 2 via line 419. At 426, the image-processing system 160 may select a weighted sum of the sets of baseline image features (received via line 417 and line 419) for the plurality of orthogonal slices (e.g., for slice 1 and slice 2), including amplitude and phase information. For example, the image-processing system 160 may select or may determine or select a weighted sum, among a plurality of weighted sums, of the sets of baseline image features for the plurality of orthogonal slices (e.g., for slice 1 and slice 2) including amplitude and phase information, which most closely matches the combined multi-encoded PRF treatment image (received at 426 as an input via line 431). For example, the baseline image features that appear or are present in the combined multi-encoded PRF treatment image may be assumed to be present in one or more PRF baseline images obtained before thermal ablation is performed (and thus, not caused by or result from the thermal ablation). Thus, for example, the weighted sum of the sets of baseline image features that most closely matches the combined multi-encoded PRF treatment image includes the best or most accurate combination of baseline image features for both slices that are also present in the combined multi-encoded PRF treatment image, and which such (most accurate) baseline image features are not a result of the thermal ablation or treatment applied to the region 200.

Within phase 414, at 432, image-processing system 160 may subtract: 1) the selected weighted sum of the sets of baseline image features (e.g., which may be the weighted sum of the sets of baseline image features that most closely matches the combined multi-encoded PRF treatment image), received via line 430, from 2) the combined multi-encoded PRF treatment image, received via line 428, to obtain a combined treatment-specific temperature information of the region 200 (e.g., imaging region or treatment region of the patient) that provides multi-orthogonal slice (e.g., for slice 1 and slice 2) temperature information associated with or resulting from treatment or thermal ablation of the imaging region of the patient after subtraction or removal of the baseline image features. The combined treatment-specific temperature information is output via line 434. The combined treatment-specific temperature information, output at line 434, may include temperature information (e.g., per-pixel phase information, for multiple slices) that is associated with or results from (e.g., only from) the treatment or thermal ablation of region 200, and does not include temperature information from the set of PRF baseline images or pre-treatment temperature information, since the (e.g., best matching or most accurate) weighted sum of the sets of baseline image features from slices 1 and 2 have now been removed or subtracted at 432.

Within phase 414, at 436, image-processing system 160 processes (e.g., de-aliases or separates), e.g., based on the different encoding patterns for the plurality of orthogonal slices, the combined treatment-specific temperature information (received via line 434) of region 200 to obtain slice-specific treatment-specific temperature information for each of the plurality of orthogonal slices. The slice-specific temperature-specific temperature information may include per-pixel phase information, for each slice, that indicates per-pixel temperature or temperature information that is due to or results from the thermal ablation of region 200, since the temperature information due to the set of baseline image features was previously subtracted, and now the combined treatment-specific temperature information has been de-aliased or separated into slice-specific temperature information for each orthogonal slice.

For example, the de-aliasing may include de-aliasing, based on the different encoding patterns for the plurality of orthogonal slices and/or based on mathematical sparsity of the treatment-specific temperature information for each of the orthogonal slices, the combined treatment-specific temperature information of the region 200 to obtain slice-specific treatment-specific temperature information for each of the plurality of orthogonal slices. For example, the de-aliasing may include removing or decoding the encoding patterns used for the plurality of orthogonal slices to separate the slice-specific treatment-specific temperature information among the plurality of orthogonal slices, and correctly apportioning temperature information to one or more of the slice-specific treatment-specific temperature information among the plurality of orthogonal slices.

Also, for example, the correctly apportioning may include correctly apportioning temperature information to one or more of the slice-specific treatment-specific temperature information among the plurality of orthogonal slices, to obtain separate slice-specific treatment-specific temperature information for each of the plurality of orthogonal slices that indicates temperature information, per orthogonal slice, associated with or resulting from treatment or thermal ablation of the region 200 of the patient, while omitting temperature information associated with the set of baseline image features.

In an example embodiment, the processing or de-aliasing may use a minimization of a cost function, wherein slice-specific treatment-specific temperature information is apportioned to each of the plurality of orthogonal slices according to (1) a fidelity or a match of the apportioned information, when encoded and combined, to the combined treatment-specific temperature information, and (2), a mathematical sparsity of the apportioned slice-specific treatment-specific temperature information.

According to an example embodiment, as noted, the de-aliasing may use a minimization of a cost function, which may be represented as one or both of the following equations:

$$\underset{x}{\operatorname{argmin}}(|Ax-b|_2+\lambda|x|_1) \quad \text{Eqn. (1)}$$

$$=\underset{x}{\operatorname{argmin}}(|E_1Fx_1+E_2Fx_2-b|_2+\lambda|x|_1) \quad \text{Eqn. (2)}$$

where:

$x_1$, $x_2$ are images each containing slice-specific treatment-specific temperature information for different orthogonal slices.

$$x=\begin{bmatrix} x_1 \\ x_2 \end{bmatrix},$$

is a way to mathematically consider $x_1$, $x_2$ in a manner that the two images can be determined simultaneously.

b, is a representation of the combined multi-encoded PRF treatment image.

At the acquiring operation at 424 (FIG. 4), the image-processing system 160 acquires the combined multi-encoded PRF treatment image based on the applied RF excitation pulse sequences that use separate encoding patterns for each orthogonal slice. As noted, the combined multi-encoded PRF treatment image is a combination of slice-specific treatment images for the plurality of orthogonal slices that have been separately encoded using a different encoding pattern for each of the orthogonal slices. $E_1$, $E_2$ are mathematical matrices/operators that represent the encoding of slice specific treatment images.

F is the 2D Fourier transform—a component of the encoding process.

$$\underset{x}{\operatorname{argmin}}(\,),$$

means, find the x that minimizes the contents inside the parentheses.

$|E_1Fx_1+E_2Fx_2-b|_2$, is a "data fidelity" term, or a term associated with or indicating a match. Minimizing this term forces the solution wherein slice-specific treatment-specific temperature information is apportioned to each of the plurality of orthogonal slices according to a fidelity or a match of the apportioned information, when encoded and combined, to the combined treatment-specific temperature information. This means that, by minimizing that term, causes the image-processing system 160 to correctly apportion treatment-specific temperature information to orthogonal slices $x_1$, $x_2$ in such a manner that, when two slice-specific treatment specific temperature information for the orthogonal slices are encoded and combined, they closely match the combined treatment-specific temperature information of the region 200.

$\lambda|x|_1$, is a "sparsity promoting" operator. Minimizing this term results in apportioning treatment-specific information to orthogonal slices $x_1$, $x_2$ in a manner that is mathematically sparse, e.g., an increase in temperature due to thermal ablation only changes the temperature or phase information of the region 200 for a small number of pixels, such as at the hot spot. One example of sparsity is that the majority of pixels in $x_1$, $x_2$ are empty and do not contain treatment-specific temperature information (resulting from thermal ablation). The treatment-specific temperature information are contained in a minority or a relatively small number of pixels of the images.

As a result, by solving the following Eqn. (3), the image-processing system 160 obtains or determines the slice-specific treatment-specific temperature information for slice 1 and slice 2 (output from 436, FIG. 4), thus, obtaining or determining slice-specific treatment-specific temperature information $x_1$, $x_2$ for the slices, that both, when combined and encoded, closely match the combined multi-encoded PRF treatment image, b, and are arranged within $x_1$, $x_2$ in a mathematically sparse manner.

$$x=\begin{bmatrix} x_1 \\ x_2 \end{bmatrix}=\underset{x}{\operatorname{argmin}}(|E_1Fx_1+E_2Fx_2-b|_2+\lambda|x|_1) \quad \text{Eqn. (3)}$$

Figure 5:
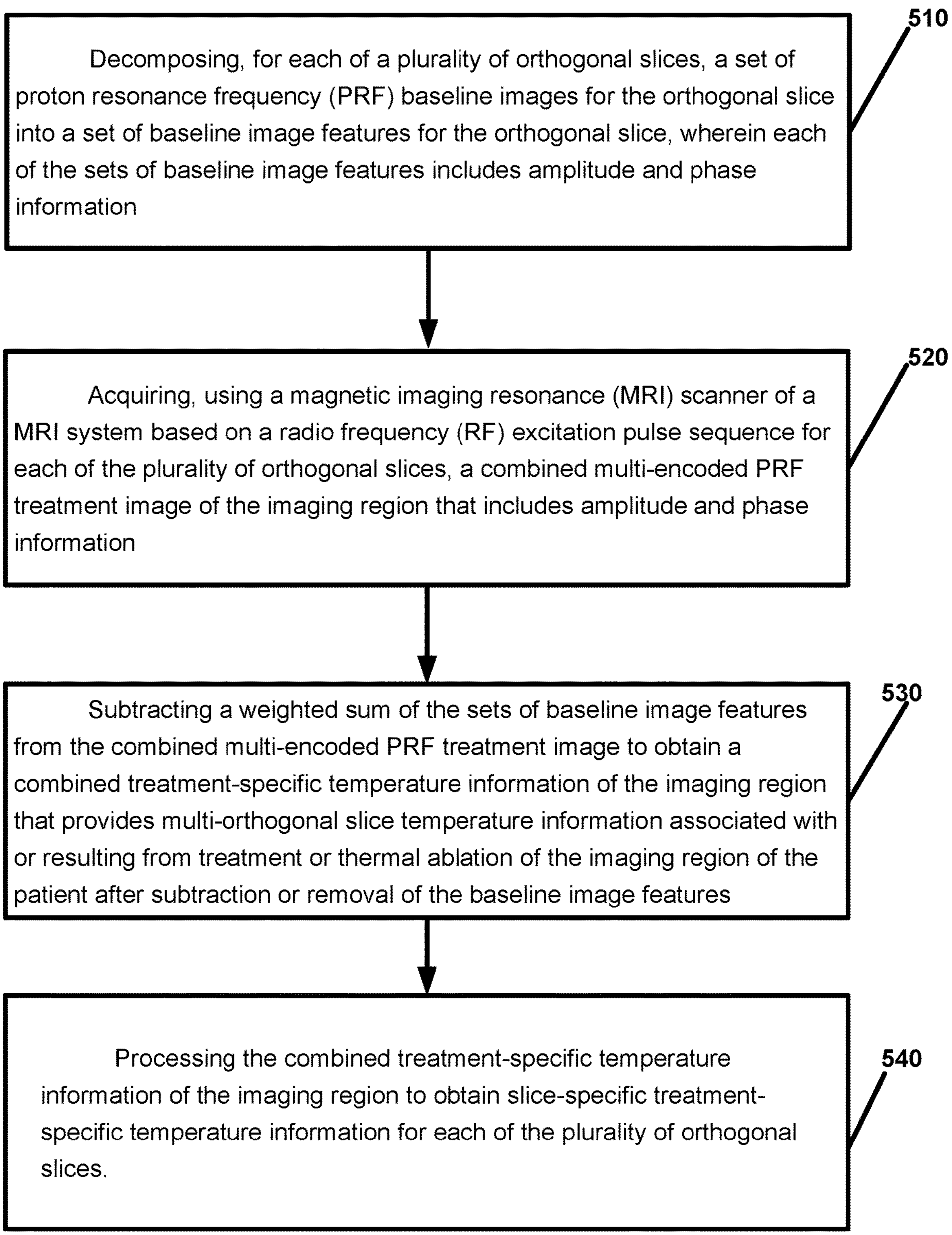
FIG. 5 is a flow chart illustrating operation of a system according to an example embodiment.

FIG. 5 is a flow chart illustrating operation of a system according to an example embodiment. Operation 510 includes decomposing, for each of a plurality of orthogonal slices, a set of proton resonance frequency (PRF) baseline images for the orthogonal slice into a set of baseline image features for the orthogonal slice, wherein each of the sets of baseline image features includes amplitude and phase information. Operation 520 includes acquiring, using a magnetic imaging resonance (MRI) scanner of a MRI system based on a radio frequency (RF) excitation pulse sequence for each of the plurality of orthogonal slices, a combined multi-encoded PRF treatment image of the imaging region that includes amplitude and phase information. Operation 530 includes subtracting a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features. And, operation 540 includes processing the combined treatment-specific temperature information of the imaging region to obtain slice-specific treatment-specific temperature information for each of the plurality of orthogonal slices. The method of example 1 may be a method of obtaining temperature information of an imaging region of a patient for magnetic resonance imaging (MRI) thermometry during treatment or thermal ablation of the imaging region of the patient.

In an example embodiment, the combined multi-encoded PRF treatment image is a combination of slice-specific treatment images for the plurality of orthogonal slices that have been separately encoded using a different encoding pattern for each of the orthogonal slices.

In an example embodiment, the method of FIG. 5 may further include performing, with the MRI system during treatment or thermal ablation of at least a portion of the imaging region of the patient, a pulse sequence including a slice-specific RF excitation pulse sequence for each of the orthogonal slices, wherein each of the slice-specific RF excitation pulse sequences is performed using a different encoding pattern.

In an example embodiment, the decomposing may include: acquiring the set of proton resonance frequency (PRF) baseline images for each of the plurality of orthogonal slices of the imaging region; and decomposing, for each of the plurality of orthogonal slices, the set of PRF baseline images for the orthogonal slice into a set of baseline image features for the orthogonal slice, wherein each of the sets of baseline image features includes amplitude and phase information and are not associated with the treatment or thermal ablation of the imaging region of the patient.

In an example embodiment the acquiring the set of proton resonance frequency (PRF) baseline images comprises: acquiring the set of proton resonance frequency (PRF) baseline images for each of the plurality of orthogonal slices of the imaging region based on slice-specific RF excitation pulse sequences performed or applied for each of the orthogonal slices used to acquire the combined multi-encoded PRF treatment image.

In an example embodiment, the combined multi-encoded PRF treatment image includes amplitude and phase information for features including both: 1) the set of baseline image features, including amplitude and phase information, for each of the plurality of orthogonal slices and 2) amplitude and phase information for treatment specific features that resulted from or are associated with treatment or thermal ablation of the imaging region of the patient.

In an example embodiment, the method of FIG. 5 may further include: determining the weighted sum of the sets of baseline image features for the plurality of orthogonal slices, including amplitude and phase information.

In an example embodiment, the determining the weighted sum may include: determining the weighted sum, among a plurality of weighted sums, of the sets of baseline image features for the plurality of orthogonal slices, including amplitude and phase information, which most closely matches the combined multi-encoded PRF treatment image.

In an example embodiment, the processing the combined treatment-specific temperature information may include: de-aliasing, based on the different encoding patterns for the plurality of orthogonal slices, the combined treatment-specific temperature information of the imaging region to obtain slice-specific treatment-specific temperature information for each of the plurality of orthogonal slices.

In an example embodiment, the processing the combined treatment-specific temperature information may include: de-aliasing, based on the different encoding patterns for the plurality of orthogonal slices and also based on mathematical sparsity of the treatment-specific temperature information for each of the orthogonal slices, the combined treatment-specific temperature information of the imaging region to obtain slice-specific treatment-specific temperature information for each of the plurality of orthogonal slices.

In an example embodiment, the de-aliasing may include: removing or decoding the encoding patterns used for the plurality of orthogonal slices to separate the slice-specific treatment-specific temperature information among the plurality of orthogonal slices; and correctly apportioning temperature information to one or more of the slice-specific treatment-specific temperature information among the plurality of orthogonal slices.

In an example embodiment, the correctly apportioning may include: correctly apportioning temperature information to one or more of the slice-specific treatment-specific temperature information among the plurality of orthogonal slices, to obtain separate slice-specific treatment-specific temperature information for each of the plurality of orthogonal slices that indicates temperature information, per orthogonal slice, associated with or resulting from treatment or thermal ablation of the imaging region of the patient, while omitting temperature information associated with the baseline image features.

In an example embodiment, the de-aliasing may use a minimization of a cost function, wherein slice-specific treatment-specific temperature information is apportioned to each of the plurality of orthogonal slices according to (1) a fidelity or a match of the apportioned information, when encoded and combined, to the combined treatment-specific temperature information, and (2), a mathematical sparsity of the apportioned slice-specific treatment-specific temperature information.

In an example embodiment, the decomposing, for each of the plurality of orthogonal slices, the set of PRF baseline images for the orthogonal slice into a set of baseline image features for the orthogonal slice may be performed based on at least one of the following techniques: a singular value decomposition of the set of PRF baseline images for each of the plurality of orthogonal slices; a Fourier Transform of information of the set of PRF baseline images for each of the plurality of orthogonal slices; or a Wavelet Transform of information of the set of PRF baseline images for each of the plurality of orthogonal slices.

According to another example embodiment, an apparatus may include: at least one processor; and at least one memory storing instructions that, when executed by the at least one processor, cause the apparatus at least to: decompose, for each of a plurality of orthogonal slices, a set of proton resonance frequency (PRF) baseline images for the orthogonal slice into a set of baseline image features for the orthogonal slice, wherein each of the sets of baseline image features includes amplitude and phase information; acquire, using a magnetic imaging resonance (MRI) scanner of a MRI system based on a radio frequency (RF) excitation pulse sequence for each of the plurality of orthogonal slices, a combined multi-encoded PRF treatment image of the imaging region that includes amplitude and phase information; subtract a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features; and process the combined treatment-specific temperature information of the imaging region to obtain slice-specific treatment-specific temperature information for each of the plurality of orthogonal slices.

According to another example embodiment, a non-transitory computer-readable storage medium may include instructions stored thereon that, when executed by at least one processor, are configured to cause a computing system to: decompose, for each of a plurality of orthogonal slices, a set of proton resonance frequency (PRF) baseline images for the orthogonal slice into a set of baseline image features for the orthogonal slice, wherein each of the sets of baseline image features includes amplitude and phase information; acquire, using a magnetic imaging resonance (MRI) scanner of a MRI system based on a radio frequency (RF) excitation pulse sequence for each of the plurality of orthogonal slices, a combined multi-encoded PRF treatment image of the imaging region that includes amplitude and phase information; subtract a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features; and process the combined treatment-specific temperature information of the imaging region to obtain slice-specific treatment-specific temperature information for each of the plurality of orthogonal slices.

According to another example embodiment, a method may be provided for obtaining temperature information of an imaging region of a patient for magnetic resonance imaging (MRI) thermometry during treatment or thermal ablation of the imaging region of the patient, the method including: decomposing, for each of a plurality of orthogonal slices, a set of proton resonance frequency (PRF) baseline images for the orthogonal slice into a set of baseline image features for the orthogonal slice, wherein each of the sets of baseline image features includes amplitude and phase information; acquiring, using a MRI scanner of a MRI system based on a radio frequency (RF) excitation pulse sequence for each of the plurality of orthogonal slices, a combined multi-encoded PRF treatment image of the imaging region that includes amplitude and phase information, wherein the combined multi-encoded PRF treatment image is a combination of slice-specific treatment images for the plurality of orthogonal slices that have been separately encoded using a different encoding pattern for each of the orthogonal slices; subtracting a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features; and de-aliasing, based on the different encoding patterns for the plurality of orthogonal slices, the combined treatment-specific temperature information of the imaging region to obtain slice-specific treatment-specific temperature information for each of the plurality of orthogonal slices.

According to another example embodiment, a method may be provided for obtaining temperature information of an imaging region of a patient for magnetic resonance imaging (MRI) thermometry during treatment or thermal ablation of the imaging region of the patient, the method including: decomposing, for each of a plurality of orthogonal slices, a set of proton resonance frequency (PRF) baseline images for the orthogonal slice into a set of baseline image features for the orthogonal slice, wherein each of the sets of baseline image features includes amplitude and phase information; performing, with a MRI system during treatment or thermal ablation of at least a portion of the imaging region of the patient, a pulse sequence including a slice-specific RF (radio frequency) excitation pulse sequence for each of the orthogonal slices, wherein each of the slice-specific RF excitation pulse sequences is performed using a different encoding pattern; acquiring, using a MRI scanner of the MRI system based on the RF excitation pulse sequence for each of the plurality of orthogonal slices, a combined multi-encoded PRF treatment image of the imaging region that includes amplitude and phase information, wherein the combined multi-encoded PRF treatment image is a combination of slice-specific treatment images for the plurality of orthogonal slices that have been separately encoded using a different encoding pattern for each of the orthogonal slices; selecting a weighted sum of the sets of baseline image features for the plurality of orthogonal slices, including amplitude and phase information; subtracting the selected weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of the patient after subtraction or removal of the baseline image features; and de-aliasing, based on the different encoding patterns for the plurality of orthogonal slices, the combined treatment-specific temperature information of the imaging region to obtain slice-specific treatment-specific temperature information for each of the plurality of orthogonal slices.

While certain features of the described embodiments have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. A method comprising:

decomposing, for each of a plurality of orthogonal slices, a set of proton resonance frequency (PRF) baseline images for the orthogonal slice into a set of baseline image features for the orthogonal slice, wherein each of the sets of baseline image features includes amplitude and phase information;

acquiring, using a magnetic imaging resonance (MRI) scanner of a MRI system based on a radio frequency (RF) excitation pulse sequence for each of the plurality of orthogonal slices, a combined multi-encoded PRF treatment image of an imaging region that includes amplitude and phase information;

subtracting a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of a patient after subtraction or removal of the baseline image features, wherein the weighted sum of the sets of baseline image features includes both amplitude and phase information; and processing the combined treatment-specific temperature information of the imaging region to obtain slice-specific treatment-specific temperature information for each of the plurality of orthogonal slices, including de-aliasing, based on different encoding patterns for the plurality of orthogonal slices and also based on mathematical sparsity of the treatment-specific temperature information for each of the orthogonal slices, the combined treatment-specific temperature information of the imaging region to obtain slice-specific treatment-specific temperature information for each of the plurality of orthogonal slices.

2. The method of claim 1, wherein the method is a method of obtaining temperature information of an imaging region of the patient for magnetic resonance imaging (MRI) thermometry during treatment or thermal ablation of the imaging region of the patient.

3. The method of claim 1, wherein the combined multi-encoded PRF treatment image is a combination of slice-specific treatment images for the plurality of orthogonal slices that have been separately encoded using a different encoding pattern for each of the orthogonal slices.

4. The method of claim 1, further comprising:

performing, with the MRI system during treatment or thermal ablation of at least a portion of the imaging region of the patient, a pulse sequence including a slice-specific RF excitation pulse sequence for each of the orthogonal slices, wherein each of the slice-specific RF excitation pulse sequences is performed using a different encoding pattern.

5. The method of claim 1, wherein the decomposing comprises:

acquiring the set of proton resonance frequency (PRF) baseline images for each of the plurality of orthogonal slices of the imaging region; and decomposing, for each of the plurality of orthogonal slices, the set of PRF baseline images for the orthogonal slice into a set of baseline image features for the orthogonal slice, wherein each of the sets of baseline image features includes amplitude and phase information and are not associated with the treatment or thermal ablation of the imaging region of the patient.

6. The method of claim 5, wherein the acquiring the set of proton resonance frequency (PRF) baseline images comprises:

acquiring the set of proton resonance frequency (PRF) baseline images for each of the plurality of orthogonal slices of the imaging region based on slice-specific RF excitation pulse sequences performed or applied for each of the orthogonal slices used to acquire the combined multi-encoded PRF treatment image.

7. The method of claim 1, wherein the combined multi-encoded PRF treatment image includes amplitude and phase information for features including both: 1) the set of baseline image features, including amplitude and phase information, for each of the plurality of orthogonal slices and 2) amplitude and phase information for treatment specific features that resulted from or are associated with treatment or thermal ablation of the imaging region of the patient.

8. The method of claim 1, further comprising:

determining the weighted sum of the sets of baseline image features for the plurality of orthogonal slices, including amplitude and phase information.

9. The method of claim 8, wherein the determining the weighted sum comprises:

determining the weighted sum, among a plurality of weighted sums, of the sets of baseline image features for the plurality of orthogonal slices, including amplitude and phase information, which most closely matches the combined multi-encoded PRF treatment image.

10. The method of claim 1, wherein the processing the combined treatment-specific temperature information comprises:

de-aliasing, based on different encoding patterns for the plurality of orthogonal slices, the combined treatment-specific temperature information of the imaging region to obtain slice-specific treatment-specific temperature information for each of the plurality of orthogonal slices.

11. The method of claim 10, wherein the de-aliasing uses a minimization of a cost function, wherein slice-specific treatment-specific temperature information is apportioned to each of the plurality of orthogonal slices according to (1) a fidelity or a match of the apportioned information, when encoded and combined, to the combined treatment-specific temperature information, and (2), a mathematical sparsity of the apportioned slice-specific treatment-specific temperature information.

12. The method of claim 1, wherein the de-aliasing comprises at least one of the following:

removing or decoding the different encoding patterns used for the plurality of orthogonal slices to separate the slice-specific treatment-specific temperature information among the plurality of orthogonal slices; and correctly apportioning temperature information to one or more of the slice-specific treatment-specific temperature information among the plurality of orthogonal slices.

13. The method of claim 12, wherein the correctly apportioning temperature information comprises:

correctly apportioning temperature information to one or more of the slice-specific treatment-specific temperature information among the plurality of orthogonal slices, to obtain separate slice-specific treatment-specific temperature information for each of the plurality of orthogonal slices that indicates temperature information, per orthogonal slice, associated with or resulting from treatment or thermal ablation of the imaging region of the patient, while omitting temperature information associated with the baseline image features.

14. The method of claim 1, wherein the decomposing, for each of the plurality of orthogonal slices, the set of PRF baseline images for the orthogonal slice into a set of baseline image features for the orthogonal slice is performed based on at least one of the following techniques:

a singular value decomposition of the set of PRF baseline images for each of the plurality of orthogonal slices;

a Fourier Transform of information of the set of PRF baseline images for each of the plurality of orthogonal slices; or a Wavelet Transform of information of the set of PRF baseline images for each of the plurality of orthogonal slices.

15. An apparatus, comprising:

at least one processor; and at least one memory storing instructions that, when executed by the at least one processor, cause the apparatus at least to:

decompose, for each of a plurality of orthogonal slices, a set of proton resonance frequency (PRF) baseline images for the orthogonal slice into a set of baseline image features for the orthogonal slice, wherein each of the sets of baseline image features includes amplitude and phase information;

acquire, using a magnetic imaging resonance (MRI) scanner of a MRI system based on a radio frequency (RF) excitation pulse sequence for each of the plurality of orthogonal slices, a combined multi-encoded PRF treatment image of an imaging region that includes amplitude and phase information;

subtract a weighted sum of the sets of baseline image features from the combined multi-encoded PRF treatment image to obtain a combined treatment-specific temperature information of the imaging region that provides multi-orthogonal slice temperature information associated with or resulting from treatment or thermal ablation of the imaging region of a patient after subtraction or removal of the baseline image features; and process the combined treatment-specific temperature information of the imaging region to obtain slice-specific treatment-specific temperature information for each of the plurality of orthogonal slices, including de-alias, based on different encoding patterns for the plurality of orthogonal slices and also based on mathematical sparsity of the treatment-specific temperature information for each of the orthogonal slices, the combined treatment-specific temperature information of the imaging region to obtain slice-specific treatment-specific temperature information for each of the plurality of orthogonal slices.

16. The apparatus of claim 15, wherein the combined multi-encoded PRF treatment image is a combination of slice-specific treatment images for the plurality of orthogonal slices that have been separately encoded using a different encoding pattern for each of the orthogonal slices.

17. The apparatus of claim 15, wherein the apparatus is further caused to:

perform, with the MRI system during treatment or thermal ablation of at least a portion of the imaging region of the patient, a pulse sequence including a slice-specific RF excitation pulse sequence for each of the orthogonal slices, wherein each of the slice-specific RF excitation pulse sequences is performed using a different encoding pattern.

18. The apparatus of claim 15, wherein the apparatus caused to decompose comprises the apparatus caused to:

acquire the set of proton resonance frequency (PRF) baseline images for each of the plurality of orthogonal slices of the imaging region; and decompose, for each of the plurality of orthogonal slices, the set of PRF baseline images for the orthogonal slice into a set of baseline image features for the orthogonal slice, wherein each of the sets of baseline image features includes amplitude and phase information and are not associated with the treatment or thermal ablation of the imaging region of the patient.

19. The apparatus of claim 18, wherein the apparatus caused to acquire the set of proton resonance frequency (PRF) baseline images comprises the apparatus caused to:

acquire the set of proton resonance frequency (PRF) baseline images for each of the plurality of orthogonal slices of the imaging region based on slice-specific RF excitation pulse sequences performed or applied for each of the orthogonal slices used to acquire the combined multi-encoded PRF treatment image.

20. The apparatus of claim 15, wherein the combined multi-encoded PRF treatment image includes amplitude and phase information for features including both: 1) the set of baseline image features, including amplitude and phase information, for each of the plurality of orthogonal slices and 2) amplitude and phase information for treatment specific features that resulted from or are associated with treatment or thermal ablation of the imaging region of the patient.

* * * * *